United States Patent
Feiweier et al.

(10) Patent No.: US 10,663,550 B2
(45) Date of Patent: May 26, 2020

(54) METHOD AND COMPUTER FOR LOCAL CORRECTION OF GRADIENT NON-LINEARITIES

(71) Applicant: Siemens Healthcare GmbH, Erlangen (DE)

(72) Inventors: Thorsten Feiweier, Poxdorf (DE); Marcel Dominink Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/994,309

(22) Filed: May 31, 2018

(65) Prior Publication Data
US 2018/0348325 A1 Dec. 6, 2018

(30) Foreign Application Priority Data
May 31, 2017 (EP) ..................................... 17173750

(51) Int. Cl.
*G01R 33/56* (2006.01)
*G01R 33/565* (2006.01)
*G01R 33/563* (2006.01)

(52) U.S. Cl.
CPC ..... *G01R 33/5608* (2013.01); *G01R 33/5602* (2013.01); *G01R 33/56341* (2013.01); *G01R 33/56572* (2013.01)

(58) Field of Classification Search
CPC .................... G01R 33/5608; G01R 33/5602
(Continued)

(56) References Cited

U.S. PATENT DOCUMENTS

| 5,492,123 A * | 2/1996 | Edelman .......... G01R 33/56341 600/410 |
| 2011/0304334 A1 | 12/2011 | Feiweier |

(Continued)

OTHER PUBLICATIONS

Bammer et al., "Analysis and Generalized Correction of the Effect of Spatial Gradient Field Distortions in Diffusion-Weighted Imaging," Magnetic Resonance in Medicine, vol. 50, pp. 560-569 (2003).

(Continued)

*Primary Examiner* — Reena Aurora
(74) *Attorney, Agent, or Firm* — Schiff Hardin LLP

(57) ABSTRACT

In a method and magnetic resonance (MR) apparatus for generating an approximated trace-weighted MR image of a subject, at least three diffusion-weighted MR images of the subject are created, based on different diffusion encoding directions and diffusion gradient fields with essentially equal diffusion encoding strengths. A weighting factor is determined by an optimization method based on spatial inhomogeneities of the diffusion gradient fields for each image point of the at least three diffusion-weighted MR images. Based on the weighting factors, the at least three diffusion-weighted MR images are combined to generate the approximated trace-weighted MR image. Furthermore, an ADC map is determined based on approximated trace-weighted images and the effective diffusion encoding strength. Furthermore, a trace-weighted MR image is synthesized with nominal diffusion encoding strength based on a trace-weighted image with effective diffusion encoding strength.

15 Claims, 2 Drawing Sheets

(58) Field of Classification Search
USPC .......................................................... 324/309
See application file for complete search history.

(56) References Cited

U.S. PATENT DOCUMENTS

| 2015/0137813 | A1  | 5/2015 | Chenevert et al. |              |
|--------------|-----|--------|------------------|--------------|
| 2016/0202338 | A1* | 7/2016 | Kimura           | G01R 33/5608 |
|              |     |        |                  | 324/309      |
| 2017/0003368 | A1* | 1/2017 | Rathi            | G01R 33/5608 |
| 2017/0212199 | A1* | 7/2017 | Itriago Leon     | G01R 33/4835 |

OTHER PUBLICATIONS

Malyarenko et al., "Analysis and correction of gradient nonlinearity bias in ADC measurements," Magnetic Resonance in Medicine, vol. 71, No. 3, pp. 1312-1323 (2014).

Malyarenko et al., "Practical Estimate of Gradient Nonlinearity for Implementation of Apparent Diffusion Coefficient Bias Correction," Journal of Magnetic Resonance Imaging, vol. 40, No. 6, pp. 1487-1495 (2013).

Conturo et al., "Encoding of Anisotropic Diffusion with Tetrahedral Gradients: A General Mathematical Diffusion Formalism and Experimental Results," Magnetic Resonance in Medicine, vol. 35, pp. 399-412 (1996).

Freiweier, Thorsten et al. "Method for correcting gradient non-linearities in the case of diffusion scans with one direction" -Prior Art Journal, vol. 09, pp. 64-65, 2017// ISBN: 978-3-945188-62-0.

* cited by examiner

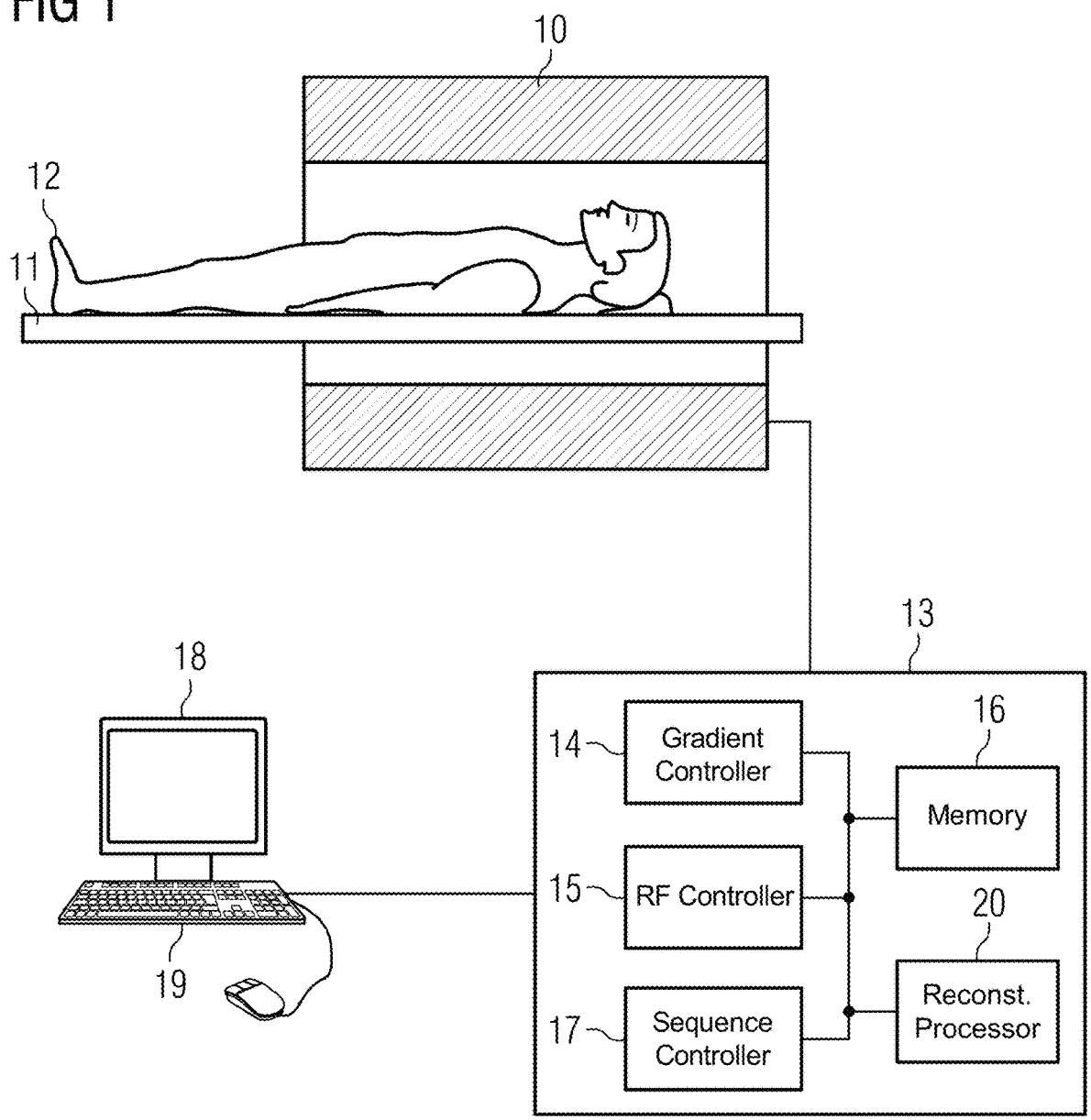

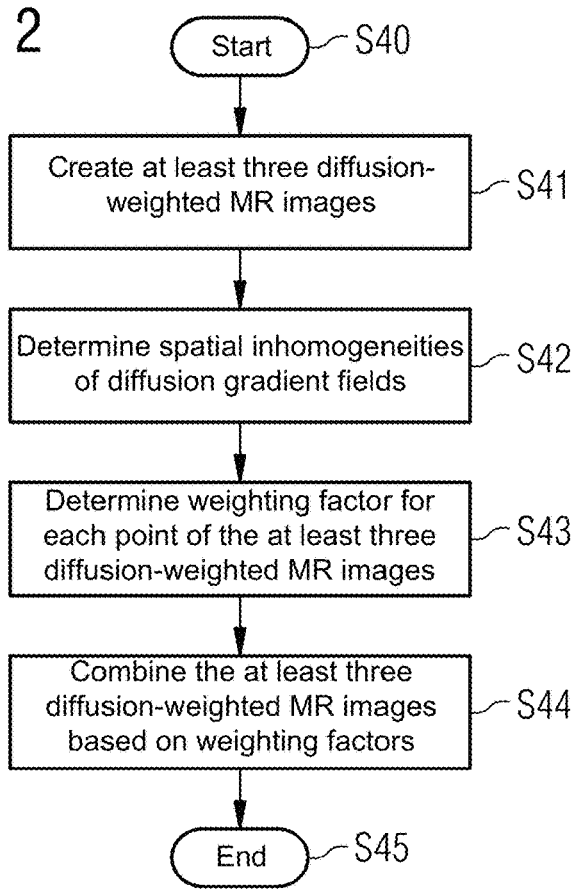
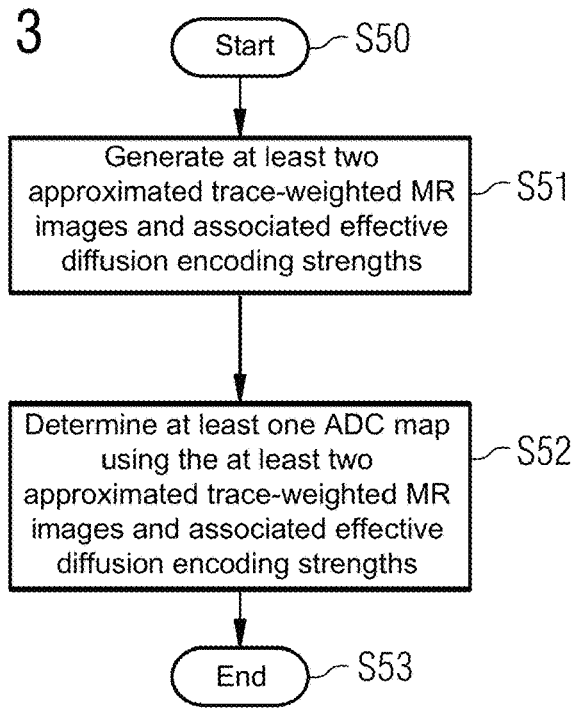

METHOD AND COMPUTER FOR LOCAL CORRECTION OF GRADIENT NON-LINEARITIES

BACKGROUND OF THE INVENTION

Field of the Invention

The present invention concerns diffusion imaging with the use of a magnetic resonance (MR) system, and in particular to a method for local correction of gradient non-linearities with diffusion imaging with the use of an MR system. The present invention also concerns an MR apparatus and a non-transitory, computer-readable data storage medium that implements such a method.

Description of the Prior Art

Diffusion imaging with the use of an MR system is currently an indispensable method in medical diagnostics. One established application is determining trace-weighted MR images in which direction-dependent diffusion effects are averaged such that the result is rotation invariant. On the basis of these trace-weighted MR images, apparent diffusion coefficients (ADCs) can also be calculated, which correspond to the rotation-invariant trace of the diffusion tensor divided by its dimension. These are parameters independent of the MR protocol and are becoming increasingly more clinically important.

The correction of undesirable influencing variables is very important in the case of ADC quantification. One fundamental influencing variable is systematic spatial variation of the diffusion gradient fields, in particular non-linearities due to the design lead to location-dependent diffusion weightings and directions, which uncorrected result in the generation of incorrect trace-weighted MR images.

For immediate calculation of the ADCs based on three diffusion directions (trace imaging), there are studies, which are directed toward correction of the ADC values without finding an optimally ideal averaging of diffusion-weighted MR images for generating an approximated trace-averaged MR image in advance. The article "Analysis and Correction of Gradient Nonlinearity Bias in ADC Measurement" by Malyarenko et al., Magnetic Resonance in Medicine, Vol. 71, No. 3, pp. 1312-1323 (2014) describes the approximate correction of gradient non-linearities when determining the ADC in the case of trace weighted imaging with three (nominal orthogonal) diffusion directions.

The article "Analysis and Generalized Correction of the Effect of Gradient Field Distortions in Diffusion-Weighted Imaging" by Bammer et al., Magnetic Resonance in Medicine, Vol. 50, pp. 560-569 (2003) describes the exact correction of gradient non-linearities when determining the ADCs based on a tensor reconstruction, for which at least six (non-collinear) diffusion directions as well as at least one further scan with different diffusion weighting are necessary.

DE 10 2010 029 932 A1 describes a method for correction of image distortions, which occur during acquisition of diffusion-weighted MR images of an examination object, wherein a reference image is acquired by means of a second acquisition process.

Current MR systems for diffusion imaging ignore these problems and assume ideal linear diffusion gradients, and this leads to systematic errors, increasing with distance from the isocenter, when determining trace-weighted MR images and ADC maps derived therefrom.

SUMMARY OF THE INVENTION

There is therefore a need for an improved method for generating trace-weighted MR images and ADC maps derived therefrom, which quickly and efficiently takes into account local non-linearities of the diffusion gradient fields.

According to a first aspect of the invention, a method for generating an approximated trace-weighted MR image of an examination object, in a first step, at least three diffusion-weighted MR images of the examination object are created, wherein each diffusion-weighted MR image is based on a diffusion encoding. In general, the diffusion encoding is described by a symmetrical 3×3 matrix. In a good approximation, this is usually a direction and a value, in other words, the diffusion encoding has a diffusion encoding direction and an associated diffusion gradient field with a particular value.

The diffusion encoding direction of each diffusion-weighted MR image is different from the diffusion encoding directions of the other diffusion-weighted MR images. Furthermore, the diffusion gradient field of each diffusion-weighted MR image has essentially the same nominal diffusion encoding strength as the diffusion gradient fields of the other diffusion-weighted MR images. In a further step of the method according to the invention, spatial inhomogeneities of the diffusion gradient fields are determined in a computer provided with the three diffusion-weighted MR images. Spatial inhomogeneities can comprise spatial deviations of the actual diffusion gradient fields from nominally specified diffusion gradient fields. In a further step, a weighting factor is determined in the computer for each image point for each of the at least three diffusion-weighted MR images based on the spatial inhomogeneities by way of an optimization method, in other words, a weighting factor map is determined for each of the at least three diffusion-weighted MR images. In a further step, the at least three diffusion-weighted MR images are combined in the computer based on the weighting factors for generating an approximated trace-weighted MR image. The resulting combination image is displayed at a display screen in communication with the computer.

The inventive method allows determination of approximated trace-weighted MR images from at least three diffusion scans with different, not necessarily orthogonal, directions and optionally slightly differing weightings in situations in which geometric averaging does not lead to the desired result. For example, this is relevant in cases in which the diffusion directions have spatial variations. In particular, systematic spatial variations in the gradient fields (for example owing to non-linearities as a result of the coil design) can be taken into account thereby when determining trace-weighted MR images and ADC maps derived therefrom.

The inventive method is not limited to a specific number of diffusion encodings. It can also be used in the clinically ever more relevant tetrahedral "4-scan trace" encoding, which is described in more detail in the article by Conturo et al., "Encoding of Anisotropic Diffusion with Tetrahedral Gradients: A General Mathematical Diffusion Formalism and Experimental Results," Magnetic Resonance in Medicine, Vol. 35, pp. 399-412 (1996).

Here, the diffusion encoding is described by a symmetrical matrix, the b-matrix. In the clinically relevant application this has only one dominant intrinsic value, which then defines diffusion direction and diffusion strength. Trace-weighted images are obtained if the b-matrices of different diffusion encodings are superpositioned in relation to a matrix proportional to the unit matrix. With 4-scan trace, the dominant diffusion directions form a tetrahedron (or when considered alternatively, 4 of 8 corners of a cube). For this choice, the total of the outer products of the characteristic vectors are proportional to the unit matrix.

In contrast to the approach by Malyarenko et al., the inventive method can also be used with more than three directions, and it can also be used with non-orthogonal diffusion directions. Furthermore, the inventive method allows the direct determination of virtually trace-weighted MR images, without corrected ADCs having to be calculated (explicitly or implicitly) in advance. Diffusion scans having a plurality of (at least three) directions with nominally identical b-value are sufficient for this.

In contrast to the approach by Bammer et al., the inventive method also functions in cases where the available data is not sufficient for determining a diffusion tensor. In particular, virtually trace-weighted MR images can be determined from diffusion scans with less than six directions, and from at least three diffusion scans with a nominally identical b-value.

An improved method for generating trace-weighted MR images and derived ADC maps is thereby provided, which quickly and efficiently takes into account local non-linearities of the diffusion gradient fields, therefore enabling a higher quality and less expensive examination of an examination person with the aid of an MR system than by way of conventional MR systems.

Each weighting factor can be an exponent of the image signal of the associated diffusion-weighted MR image. The design of the weighting factor as an exponent of the image signal of the associated diffusion-weighted MR image provides an improved method for generating trace-weighted MR images and derived ADC maps.

Combining the diffusion-weighted MR images can comprise multiplying the signal strengths of the diffusion-weighted MR images, wherein the image signal of each diffusion-weighted MR image is weighted at each image point by the associated weighting factor map as an exponent. The weighting of the image signals by exponents on multiplication of the diffusion-weighted MR images achieves a more accurate combination of the image signals and therewith a further improved quality of the approximated trace-weighted MR images.

The diffusion-weighted MR images can be combined in each image point according to formula $$S^{(approximated\ trace)} = \prod_{n=1}^{N} S_n^{\alpha_n}$$

where $S^{(approximated\ trace)}$ represents the signal of the approximated trace-weighted MR image, $S_n$ is the signals of the scanned diffusion-weighted MR images with N different diffusion encodings and $\alpha_n$ the location-dependent weighting factor at the given image point of diffusion-weighted MR image. Weighting by way of the formula above enables a simplified and therewith more efficient combination of the diffusion-weighted MR images.

Determining the weighting factor for each image point and for each diffusion-weighted MR image by way of an optimization method can also comprise minimizing a trace-less portion of the approximated trace-weighted MR image. Minimizing a trace-less portion of the approximated trace-weighted MR image means that in the case of non-orthogonal diffusion directions of the diffusion-weighted MR images, an approximated trace-weighted MR image is found, which is further approximated to a trace-weighted MR image in an optimized and improved manner.

The trace-less portion of the approximated trace-weighted MR image can be minimized by minimizing the term $$\|R^{(traceless\ spin2\ contribution)}\|_F^2 = Tr\left[\left(\sum_{n=1}^{N}\alpha_n f_n - \frac{1}{3}Tr\left[\sum_{n=1}^{N}\alpha_n f_n\right]1\right)^2\right] =$$

$$\sum_{m=1}^{N}\sum_{n=1}^{N}\alpha_n\alpha_m\left(Tr[f_m f_n] - \frac{1}{3}Tr[f_n]Tr[f_m]\right)$$

where N is the number of diffusion-weighted MR images, where $f_n$ is a matrix of the effective diffusion encoding strengths according to each image point of a diffusion gradient field, and where $\alpha_n$, $\alpha_m$ are the weighting factors of diffusion-weighted MR images at the examined image point. Minimizing the trace-less portion of the approximated trace-weighted MR image by minimizing the term above enables an efficient and fast mathematical solution to the optimization problem.

Minimizing can be performed under the condition that the weighting factors in total produce the value 1, so the approximated trace-weighted MR image is proportional to the magnetization and therewith an increased quality.

The at least three diffusion encoding directions cannot be orthogonal to each other, so the diffusion-weighted MR images can be scanned more easily, in particular image data of the clinically ever more relevant tetrahedral "4-scan trace" encoding can be used thereby.

The at least three diffusion-weighted MR images of the examination object can comprise at least four diffusion-weighted MR images of the examination object. The at least three diffusion-weighted MR images can comprise any number of diffusion-weighted MR images greater than three. Because the method is not set to three, four or another fixed number of diffusion-weighted MR images, it enables a more flexible and efficient generation of approximated trace-weighted MR images with a higher image quality.

The method can comprise a further step, wherein an effective diffusion encoding strength is determined for each image point based on the spatial inhomogeneities of the diffusion gradient fields and the weighting factors. This enables a local correction of the image data.

The effective diffusion encoding strength $b^{effective}$ can be determined by the formula $$b^{effective} = Tr\left[\sum_{n=1}^{N}\alpha_n f_n\right]$$

where N is the number of diffusion-weighted MR images, where $f_n$ is a matrix of the effective diffusion encoding strength corresponding to each image point of a diffusion gradient field, and where $\alpha_n$ is a weighting factor of a diffusion-weighted MR image corresponding to each image point. The local effective diffusion encoding strength can be calculated quickly and efficiently as a result of the formula above.

The method can also be designed for synthesizing a trace-weighted MR image with nominal diffusion encoding strength, wherein the method comprises the following further steps. In a first further step, at least two approximated trace-weighted MR images and the associated effective diffusion encoding strengths $b^{effective}$ can be generated based on at least two different nominal diffusion encoding strengths. In an additional step, at least one apparent diffusion coefficient (ADC) map can be determined using the at least two approximated trace-weighted MR images and the associated effective diffusion encoding strengths $b^{effective}$. In yet a further step, a trace-weighted MR image according to a nominal diffusion encoding strength can be generated based on the at least one ADC map and one of the approximated trace-weighted MR images. Synthesizing a trace-weighted MR image with nominal diffusion encoding strength enables improved imaging of higher quality and therewith a more accurate examination of an examination person.

According to a further aspect of the invention, an MR apparatus for generating an approximated trace-weighted MR image has an MR scanner operated by a control computer, and a memory in which control information is stored that can be implemented by the MR control unit. The MR apparatus is designed to carry out the following steps when the control information is implemented in the control computer.

In a first step, at least three diffusion-weighted MR images of the examination object are acquired, wherein each diffusion-weighted MR image is based on a diffusion encoding direction and an associated diffusion gradient field. The diffusion encoding direction of each diffusion-weighted MR image are different to the diffusion encoding directions of the other diffusion-weighted MR images, and the diffusion gradient field of each diffusion-weighted MR image has essentially the same nominal diffusion encoding strength as the diffusion gradient fields of the other diffusion-weighted MR images. In a further step, spatial inhomogeneities of the diffusion gradient fields are determined. In an additional step, a weighting factor for each of the at least three diffusion-weighted MR images is determined at each image point based on the spatial inhomogeneities by way of an optimization method. In a further step, the at least three diffusion-weighted MR images are combined based on the weighting factors for generating the approximated trace-weighted MR image.

The MR apparatus of the invention achieves technical effects comparable to the technical effects described above for the method according to the invention.

The present invention also encompasses a non-transitory, computer-readable data storage medium encoded with programming instructions that, when the storage medium is loaded into a computer or a computer system of a magnetic resonance apparatus, cause the computer or computer system to operate the magnetic resonance apparatus so as to implement any or all embodiments of the method according to the invention, as described above.

The features described above and features described below can be used not just in the corresponding explicitly described combinations but also in further combinations or alone without departing from the scope of the present invention.

BRIEF DESCRIPTION OF THE DRAWINGS

FIG. 1 schematically shows an MR apparatus with which the method for generating an approximated trace-weighted MR image can be implemented.

FIG. 2 is a flowchart of the basic steps of the method for generating an approximated trace-weighted MR image according to an exemplary embodiment of the invention.

FIG. 3 is a flowchart of the basic steps of the method for determining an apparent diffusion coefficient (ADC) map according to another exemplary embodiment.

DESCRIPTION OF THE PREFERRED EMBODIMENTS

In an exemplary embodiment of the invention, a local correction of gradient non-linearities in diffusion imaging is carried out with the use of an MR apparatus. An optimized combination of diffusion-weighted MR images, which comes closest to the trace averaging, is adaptively calculated for a given quantity of diffusion-weighted MR images and their exact diffusion encoding, which was potentially determined locally from gradient specifications. If a trace averaging can be exactly achieved, this is found. Otherwise, the effect of the residual contributions is minimized. The inventive method is not limited to a specific number of diffusion encodings, in particular it can also be used in the clinically ever more relevant tetrahedral "4-scan trace" encoding. As a result, an effective averaged b-value is also obtained, which can differ from the nominal b-value and which can be used for calculation of the ADCs.

In diffusion-weighted MR imaging, the weighting is an important contrast corresponding to the trace of the diffusion tensor. The trace is a rotation-independent variable and is decoupled from the remaining five degrees of freedom, which form a separate non-reducible representation of the rotation group. As will be described below in detail, the trace-weighted contrast is typically obtained by a pixelwise geometric averaging of a set of suitable diffusion-weighted MR images. The diffusion encoding can, however, for example due to non-linearities of the gradient fields, differ from pixel to pixel, so the mean does not represent a trace weighting anymore and the diffusion encoding strength can change. For a particular set of created diffusion-weighted MR images and pixel-accurate knowledge of the diffusion encoding, an optimum combination, in other words, an optimum mean, which determines diffusion-weighted MR images, is determined in order to approximate a trace weighting as well as possible; the diffusion encoding strength is also determined.

FIG. 1 schematically shows an MR apparatus with which the method according to the invention for generating an approximated trace-weighted MR image can be carried out.

An examination person 12, or, more generally, an examination object, is moved into the tunnel of an MR data acquisition scanner 10 of the MR apparatus. The scanner 10 has a magnet that generates a basic field B0, with an examination person 12 arranged on a bed 11 being moved into the center of the scanner 10 in order to acquire spatially encoded magnetic resonance signals from an examination section there. By radiating radio-frequency pulse sequences and switching magnetic field gradients, the magnetization of certain nuclear spins of the person 12 generated by the basic field B0 can be disrupted by deflecting the nuclear spins from the steady state. As the deflected nuclear spins relax and return to the steady state, they emit radio-frequency signals (MR signals) that are detected by the same antenna that radiated the radio-frequency pulses, or by a different antenna. The detected MR signals are transformed, in a known manner, into image data, which can be displayed at a display screen. The general manner of operation for creating MR images and detection of the magnetic resonance signals are known to those skilled in the art, so a more detailed description is not necessary herein.

The magnetic resonance apparatus also has a control computer 13, which controls the MR scanner 10 such that the method described below is carried out for generating an approximated trace-weighted MR image. The control computer 13 has a gradient controller 14 for controlling and switching the magnetic field gradients and an RF controller 15 for controlling and radiating the RF pulse so as to deflect the nuclear spins from the steady state. For example, the imaging sequences necessary for acquiring the MR images, as well as all programs, which are necessary for operating the MR apparatus can be stored in a memory 16. A sequence controller 17 controls image acquisition, and therewith controls the sequence of the magnetic field gradients and RF pulses and the receiving intervals of MR signals, as a function of the chosen imaging sequences. The sequence controller 17 therefore also controls the gradient controller 14 and the RF controller 15. MR images can be calculated in a reconstruction processor 20, and these can be displayed on a display 18. An operator can operate the MR system via an input unit 19. The memory 16 can have imaging sequences and program modules, which carry out the inventive method on execution in the reconstruction processor 20 of one of the illustrated modules. The RF controller 15 can also be designed to improve generation of an approximated trace-weighted MR image, as will be described below in detail. In particular, the memory 16 stores control information (code) that can be implemented by the control computer 13. Furthermore, the sequence controller 17 is designed to carry out the method described below for generating an approximated trace-weighted MR image.

According to the invention, the MR apparatus of FIG. 1 is designed such that, when the control information is implemented in the control computer 13, it creates at least three diffusion-weighted MR images and combines these, based on an optimization method, as shown in FIG. 2, to form an approximated trace-weighted MR image.

In a simplified representation, the principle of generation of diffusion contrast of diffusion-weighted MR images can be described as below. A first, strong gradient moment is applied along a particular spatial direction for encoding the current position of the nuclear spins in the form of stored phase information. After a certain time, a second gradient moment corresponding to the first gradient moment is applied along the same direction for signal rephasing. In the case where the position of the nuclear spins has changed in the meantime—for example owing to a diffusion movement—this leads to incomplete signal rephasing and therefore to a reduced signal amplitude.

A diffusion experiment of this kind can be described by two parameters. Firstly, by the diffusion weighting (sensitivity to microscopic movement) and the diffusion direction (direction characteristic).

The measured signal can be modeled by the following representation:

$$S(r) = S_0(r) e^{-bD(r)}$$

Here, $S_0$ represents the signal without diffusion weighting at location r, the b-value as the value of the b-matrix describes the diffusion strength and D(r) the tissue-specific local diffusion coefficient in the chosen diffusion direction.

FIG. 2 is a flowchart with steps for carrying out the method for generating an approximated trace-weighted MR image of an examination person according to an exemplary embodiment of the invention.

The method starts in step S40. In step S41, at least three diffusion-weighted MR images of the examination object are created, with each diffusion-weighted MR image being based on a diffusion encoding direction and an associated diffusion gradient field, with the diffusion encoding direction of each diffusion-weighted MR image being different from the diffusion encoding directions of the other diffusion-weighted MR images, and with the diffusion gradient field of each diffusion-weighted MR image essentially having the same nominal diffusion encoding strength as the diffusion gradient fields of the other diffusion-weighted MR images.

For a number n of diffusion-encoded MR images with the b-matrix $b_n$, the image contrast (in other words, the image signal) $S_n$ of a diffusion-weighted MR image is given by $$S_n = M\, e^{-Tr[Db_n]},$$

where $S_n$ is the matrix of the image signals of the image points of a diffusion-weighted MR image, where n identifies a diffusion direction, where M is the matrix of the magnetizations according to the image points, where D is the 3×3 diffusion matrix of the diffusion constants, and where $b_n$ is the 3×3 matrix of the $b_n$-values of the diffusion encoding strength.

In a case with only a single diffusion direction, the equation can be written as $b_n = b e_n e_n^\dagger$.

Ideally, in the case of N different diffusion directions with b-matrices $b_n$:

$$\frac{N}{3} b\mathbf{1} = \sum_{n=1}^{N} b_n$$

In this case the trace-weighted contrast is produced by the following formula:

$$\prod_{n=1}^{N} S_n^{\frac{1}{N}} = M e^{-\frac{1}{N} Tr(D \sum_{n=1}^{N} b_n)} = M e^{-\frac{1}{3} b Tr(D)}$$

In step S42, spatial inhomogeneities of the diffusion gradient fields are determined.

On the assumption that owing to the spatial inhomogeneities of the diffusion gradient fields, $b_n$ is replaced by $f_n = L b_n L^\dagger$, the balanced geometric mean is inventively replaced by a modified geometric mean $$S^{(approximated\ trace)} = \prod_{n=1}^{N} S_n^{\alpha_n}.$$

Here, the L-matrix is the location-dependent gradient coil tensor $L_{ji}(r) = (\partial B_z^{\,i}(r)/\partial j)/Gi$, where i,j=x, y, z and the method is carried out accordingly for each image point.

Furthermore, $S^{(approximated\ trace)}$ is the signal of the approximated trace-weighted MR image, $S_n$ are the signals of the scanned diffusion-weighted MR images with N different diffusion encodings, and $\alpha_n$ the location-dependent weighting factor at the given image point of a diffusion-weighted MR image. Furthermore, the diffusion directions do not have to be orthogonal to each other.

In step S43, a weighting factor for each image point of each of the at least three diffusion-weighted MR images is determined based on the spatial inhomogeneities.

The weighting factors $\alpha_n$ are determined in one exemplary embodiment by an optimization method.

The conditions described below result in one exemplary embodiment.

In order to be proportional to the magnetization, it is necessary for the weighting factors $\alpha_n$ to satisfy equation $\sum_{n=1}^{N}\alpha_n=1$.

To determine a trace of the diffusion tensor, the decomposition below $$\sum_{n=1}^{N}\alpha_n f_n = \frac{1}{3}Tr\left[\sum_{n=1}^{N}\alpha_n f_n\right]1 + R^{(traceless\ spin2\ contribution)}$$

can be carried out.

Furthermore, in one exemplary embodiment, the target of minimizing the trace-less rotation-invariant portion $R^{(traceless\ spin2\ contribution)}$ of the trace-weighted MR image is pursued.

Furthermore, in one exemplary embodiment, the actual effective b-value $b^{effective}$ can then be determined by the formula $$b^{effective} = Tr\left[\sum_{n=1}^{N}\alpha_n f_n\right].$$

In one exemplary embodiment, for minimization of $R^{(traceless\ spin2\ contribution)}$, the term $$\|R^{(traceless\ spin2\ contribution)}\|_F^2 = Tr\left[\left(\sum_{n=1}^{N}\alpha_n f_n - \frac{1}{3}Tr\left[\sum_{n=1}^{N}\alpha_n f_n\right]1\right)^2\right] =$$
$$\sum_{m=1}^{N}\sum_{n=1}^{N}\alpha_n\alpha_m\left(Tr[f_m f_n] - \frac{1}{3}Tr[f_n]Tr[f_m]\right)$$

can be minimized under the condition $\sum_{n=1}^{N}\alpha_n=1$.

This optimization problem can be reduced to an (N−1)-dimensional quadratic problem, which can be solved by standard methods. Geometrically, this corresponds to discovering the smallest ellipsoidal hypersurface, which intersects or touches a hyperplane.

In one exemplary embodiment, preferably $$v = \left(\frac{1}{N}, \ldots, \frac{1}{N}\right)^T$$

and furthermore a basis of the orthogonal space are chosen in such a way that the following applies $$\alpha = v + E\beta,$$

where the basis itself does not have to be orthogonal or normalized, and where E is the N×(N−1)-dimensional matrix of the basis vectors.

This automatically ensures the condition $\sum_{n=1}^{N}\alpha_n=1$.

Since in one exemplary embodiment the matrix $$A_{mn} = Tr[f_m f_n] - \frac{1}{3}Tr[f_n]Tr[f_m]$$

is defined, $\alpha$ can also be determined by the equation $$\alpha = v + E(E^T A E)^{-1} E^T A v.$$

In one exemplary embodiment, preferably $$E = \begin{pmatrix} 1 & & \\ & \ddots & \\ & & 1 \\ -1 & \ldots & -1 \end{pmatrix}$$

is chosen for the E-matrix. Together with the decomposition $$A = \begin{pmatrix} a & b \\ b^T & d \end{pmatrix}$$

this produces the expression $$E^T A E = a - e_N b^T - b e_N^T + d e_N e_N^T$$

where $e_{N,i}=1$ applies.

The matrices components are then determined by $$(E^T A E)_{ij} = A_{ij} - A_{Nj} - A_{iN} + A_{NN}.$$

Furthermore, the following applies $$E^T A v = \frac{1}{N}(a e_N - e_N(b^T e_N + d) + b),$$

where for the matrices elements the following applies:

$$(E^T A v)_i = \frac{1}{N}\left(\sum_{j=1}^{N-1} A_{ij} - \sum_{j=1}^{N-1} A_{Nj} - A_{NN} + A_{iN}\right)$$

In step S44, the at least three diffusion-weighted MR images are finally combined, based on the weighting factors for generating the approximated trace-weighted MR image, according to the formula mentioned above $$S^{(approximated\ trace)} = \prod_{n=1}^{N} S_n^{\alpha_n}.$$

The method ends in step S45.

FIG. 3 is a flowchart with steps for carrying out a method for determining an apparent diffusion coefficient (ADC) map according to another exemplary embodiment of the invention.

The method begins in step S50. In step S51, at least two approximated trace-weighted MR images and the associated effective diffusion encoding strengths $b^{effective}$ are generated based on at least two different nominal diffusion encoding strengths according to the steps of one of the above-described methods. In step S52, at least one ADC map is determined using the at least two approximated trace-weighted MR images and the associated effective diffusion encoding strengths $b^{effective}$. The method ends in step S53.

To summarize, a local correction of gradient non-linearities in the case of diffusion imaging is carried out with the aid of an MR system, wherein for a given quantity of diffusion-weighted MR images and their more accurate diffusion encoding, an optimized combination of diffusion-weighted MR images from at least three scans with different (non-collinear) directions and optionally different weightings is carried out in such a way that the result comes as close as possible to a trace-weighted MR images.

According to the invention, the method is not limited to a specific number of diffusion encodings and to orthogonal diffusion directions, in particular it can also be used in the clinically ever more relevant tetrahedral "4-scan trace" encoding. As a result, an effective averaged b-value, which can differ from the nominal b-value and which can be used for calculation of ADC maps, is also obtained. Furthermore, a trace-weighted MR image can be synthesized with nominal diffusion encoding strength based on a trace-weighted image with effective diffusion encoding strength.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating an approximated trace-weighted magnetic resonance (MR) image of an examination object, comprising:
   providing a computer with at least three diffusion-weighted MR images of an examination object, each of said diffusion-weighted images being based on a diffusion encoding comprising a diffusion encoding direction and an associated diffusion gradient field, with the diffusion encoding direction of each of said diffusion-weighted MR images being different, and wherein the diffusion gradient field of each diffusion-weighted MR image has a same nominal diffusion encoding gradient strength;
   in said computer, determining spatial inhomogeneities of said diffusion gradient fields;
   in said computer, determining a weighting factor for each image point of each of said at least three diffusion-weighted MR images based on the spatial inhomogeneities;
   in said computer, combining said at least three diffusion-weighted MR images based on a multiplication of respective signal strengths of the at least three diffusion-weighted MR images in accordance with said weighting factors to thereby generate the approximated trace-weighted MR image of the examination object; and
   displaying said approximated trace-weighted MR image at a display screen in communication with said computer.

2. The method as claimed in claim 1, wherein each weighting factor is an exponent of an image signal of the associated diffusion-weighted MR image.

3. The method as claimed in claim 2, comprising combining the diffusion-weighted MR images by multiplying respective signal strengths of the diffusion-weighted MR images, by the associated weighting factor as said exponent.

4. The method as claimed in claim 1, comprising combining the diffusion-weighted MR images is carried out at each image point according to $$S^{(approximated\ trace)} = \prod_{n=1}^{N} S_n^{\alpha_n}$$

wherein $S^{(approximated\ trace)}$ represents the signal of the approximated trace-weighted MR image, $S_n$ the signals of the scanned diffusion-weighted MR images where N is different diffusion encodings and $\alpha_n$ the location-dependent weighting factor at the given image point of a diffusion-weighted MR image.

5. The method as claimed in claim 1, comprising determining the weighting factor for each diffusion-weighted MR image by minimizing a trace-less portion of the approximated trace-weighted MR image.

6. The method as claimed in claim 5, comprising minimizing the trace-less portion of the approximated trace-weighted MR image is carried out by minimizing $$\|R^{(traceless\ spin2\ contribution)}\|_F^2 = Tr\left[\left(\sum_{n=1}^{N} \alpha_n f_n - \frac{1}{3}Tr\left[\sum_{n=1}^{N} \alpha_n f_n\right]1\right)^2\right] =$$

$$\sum_{m=1}^{N}\sum_{n=1}^{N} \alpha_n \alpha_m \left(Tr[f_m f_n] - \frac{1}{3}Tr[f_n]Tr[f_m]\right)$$

wherein N is the number of diffusion-weighted MR images, where $f_n$ is a matrix of the effective diffusion encoding strengths corresponding to each image point of a diffusion gradient field, and wherein $\alpha_n$, $\alpha_m$ are the weighting factors of diffusion-weighted MR images.

7. The method as claimed in claim 1, wherein the weighting factors in total produce the value 1.

8. The method as claimed in claim 1, wherein the at least three diffusion encoding directions are not orthogonal to each other.

9. The method as claimed in claim 1, comprising providing said computer with at least four diffusion-weighted MR images of the examination object.

10. The method as claimed in claim 1, comprising determining an effective diffusion encoding strength for each image point based on the spatial inhomogeneities of the diffusion gradient fields and the weighting factors.

11. The method as claimed in claim 10, comprising determining the effective diffusion encoding strength $b^{effective}$ as $$b^{effective} = Tr\left[\sum_{n=1}^{N} \alpha_n f_n\right]$$

wherein N is the number of diffusion-weighted MR images, where $f_n$ is a matrix of the effective diffusion encoding strength corresponding to each image point of a diffusion gradient field, and where $\alpha_n$ is a weighting factor of a diffusion-weighted MR image.

12. A method for determining an apparent diffusion coefficient (ADC) map, comprising:
   providing a computer with at least three diffusion-weighted MR images of an examination object, each of said diffusion-weighted images being based on a diffusion encoding comprising a diffusion encoding direction and an associated diffusion gradient field, with the diffusion encoding direction of each of said diffusion-weighted MR images being different, and wherein the diffusion gradient field of each diffusion-weighted MR image has a same nominal diffusion encoding gradient strength;
   in said computer, determining spatial inhomogeneities of said diffusion gradient fields;
   in said computer, determining a weighting factor for each image point of each of said at least three diffusion-weighted MR images based on the spatial inhomogeneities;

in said computer, combining said at least three diffusion-weighted MR images based on a multiplication of respective signal strengths of the at least three diffusion-weighted MR images in accordance with said weighting factors to thereby generate an approximated trace-weighted MR image of the examination object;

determining an effective diffusion encoding strength $b^{effective}$ for each image point based on the spatial inhomogeneities of the diffusion gradient fields and said weighting factors, as $$b^{effective} = Tr\left[\sum_{n=1}^{N} \alpha_n f_n\right]$$

wherein N is the number of diffusion-weighted MR images, where $f_n$ is a matrix of the effective diffusion encoding strength corresponding to each image point of a diffusion gradient field, and where $\alpha_n$ is a weighting factor of a diffusion-weighted MR image;

determining at least one ADC map using at least two approximated trace-weight MR images and their associated effective diffusion encoding gradient strengths $b^{effective}$; and displaying said ADC map at a display screen in communication with said computer.

13. The method as claimed in claim 12 comprising generating a trace-weighted MR image corresponding to a nominal diffusion encoding strength based on said at least one ADC map and one of said approximated trace-weighted MR images.

14. A magnetic resonance (MR) apparatus comprising:
an MR data acquisition scanner;
a computer configured to operate said MR data acquisition scanner in order to acquire raw MR diffusion data from an examination subject;
said computer being configured to reconstruct at least three diffusion-weighted MR images of said examination object from said raw MR diffusion data, each of said diffusion-weighted images being based on a diffusion encoding comprising a diffusion encoding direction and an associated diffusion gradient field, with the diffusion encoding direction of each of said diffusion-weighted MR images being different, and wherein the diffusion gradient field of each diffusion-weighted MR image has a same nominal diffusion encoding gradient strength;

said computer being configured to determine spatial inhomogeneities of said diffusion gradient fields;

said computer being configured to determine a weighting factor for each image point of each of said at least three diffusion-weighted MR images based on the spatial inhomogeneities;

said computer being configured to combine said at least three diffusion-weighted MR images based on a multiplication of respective signal strengths of the at least three diffusion-weighted MR images in accordance with said weighting factors to thereby generate an approximated trace-weighted MR image of the examination object;

a display screen in communication with said computer; and said computer being configured to display said approximated trace-weighted MR image at said display screen.

15. A non-transitory, computer-readable data storage medium encoded with programming instructions, said storage medium being loaded into a computer of a magnetic resonance (MR) apparatus, said programming instructions causing said computer to:

receive at least three diffusion-weighted MR images of an examination object, each of said diffusion-weighted images being based on a diffusion encoding comprising a diffusion encoding direction and an associated diffusion gradient field, with the diffusion encoding direction of each of said diffusion-weighted MR images being different, and wherein the diffusion gradient field of each diffusion-weighted MR image has a same nominal diffusion encoding gradient strength;

determine spatial inhomogeneities of said diffusion gradient fields;

determine a weighting factor for each image point of each of said at least three diffusion-weighted MR images based on the spatial inhomogeneities;

combine said at least three diffusion-weighted MR images based on a multiplication of respective signal strengths of the at least three diffusion-weighted MR images in accordance with said weighting factors to thereby generate an approximated trace-weighted MR image of the examination object; and display said approximated trace-weighted MR image at a display screen in communication with said computer.

* * * * *